United States Patent [19]

Sayka et al.

[11] Patent Number: 5,349,237
[45] Date of Patent: Sep. 20, 1994

[54] INTEGRATED CIRCUIT PACKAGE INCLUDING A HEAT PIPE

[75] Inventors: Anthony Sayka; Mohammad A. Siddiqui, both of San Antonio, Tex.

[73] Assignee: VLSI Technology, Inc., San Jose, Calif.

[21] Appl. No.: 854,486

[22] Filed: Mar. 20, 1992

[51] Int. Cl.$^5$ ............................................. H01L 23/28
[52] U.S. Cl. .................................. 257/715; 257/796; 174/15.2
[58] Field of Search ....................... 257/715, 796, 15.2; 174/15.2

[56] References Cited

U.S. PATENT DOCUMENTS

| | | | |
|---|---|---|---|
| 3,564,109 | 2/1971 | Ruechardt | 174/15.2 |
| 3,716,764 | 2/1973 | Birchler et al. | 317/234 |
| 4,912,548 | 3/1990 | Shanker et al. | 257/715 |
| 5,105,259 | 4/1992 | McShane et al. | 257/796 |
| 5,172,213 | 12/1992 | Zimmerman | 257/796 |
| 5,206,791 | 4/1993 | Novotny | 257/715 |

*Primary Examiner*—William Mintel
*Assistant Examiner*—Roy Potter
*Attorney, Agent, or Firm*—Burns, Doane, Swecker & Mathis

[57] ABSTRACT

A plastic-encapsulated integrated circuit includes a package formed of plastic, an integrated circuit embedded in the package, and heat-dissipating means for conducting heat from the integrated circuit, which means include a hermetically sealed container formed of a heat conductive material embedded in the package and extending from the integrated circuit to at least an outer surface of the package, and a volatile fluid disposed in the container. In operation, the volatile fluid absorbs heat from the integrated circuit when it changes from the liquid state to the vapor state, and dissipates heat when it changes from the vapor state to the liquid state.

9 Claims, 1 Drawing Sheet

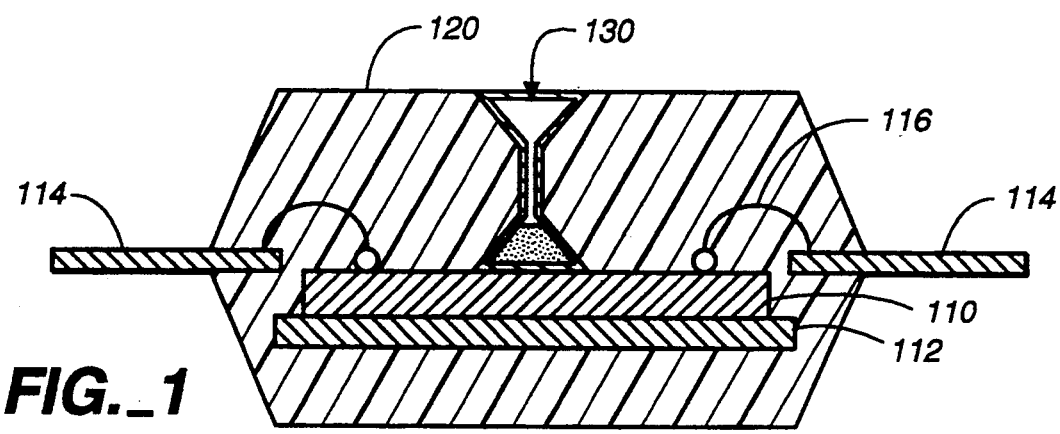
FIG._1
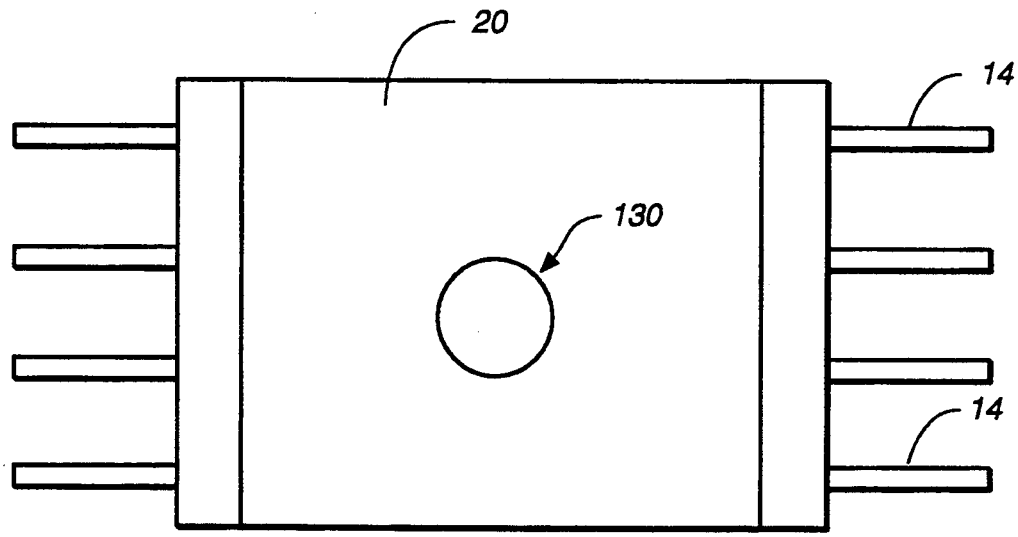
FIG._2
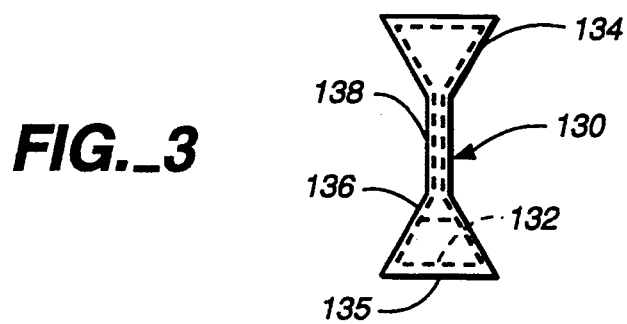
FIG._3

INTEGRATED CIRCUIT PACKAGE INCLUDING A HEAT PIPE

BACKGROUND OF THE INVENTION

1. Field of the Invention

The present invention relates to the packaging of integrated circuits.

2. State of the Art

When designing integrated circuits, thermal factors must be considered because of the heat which the circuits generate during operation. Typically, integrated circuits are encapsulated by polymeric material that has relatively low thermal conductivity and, therefore, does not effectively dissipate heat that the chips generate. In low-power integrated circuit devices, lead frames have been relied upon for dissipating heat by thermal conduction. For dissipating heat in higher power integrated circuits, metal heat spreaders or heat sinks have been attached to the outside of the package or incorporated directly into the package as an insert during the molding step.

SUMMARY OF THE INVENTION

The present invention provides a plastic-encapsulated integrated circuit that includes a package formed of plastic, at least one integrated circuit embedded in the package, and heat-dissipating means for conducting heat from the integrated circuit, which means include a hermetically sealed container formed of a heat conductive material embedded in the package and extending from the integrated circuit to at least an outer surface of the package, and a volatile fluid disposed in the container. The volatile fluid absorbs heat from the integrated circuit while converting from a liquid to a vapor state, and dissipates the heat while converting from a vapor state to a liquid state. That is, the volatile fluid absorbs heat from the integrated circuit when it changes from the liquid state to the vapor state, and dissipates heat when it changes from the vapor state to the liquid state.

Preferably, the container includes first and second frusto-conical portions disposed adjacent the integrated circuit and the outer surface of the package, respectively, and an intermediate cylindrical portion interconnecting the first and second portions. The intermediate portion is preferably of smaller cross-section than the first and second portions.

Also, the container is preferably formed of metal so as to exhibit a high coefficient of thermal conductivity. Further, the lower end of the container preferably is bonded to the integrated circuit, as by a heat-conductive adhesive.

BRIEF DESCRIPTION OF THE DRAWINGS

The present invention can be further understood with reference to the following description in conjunction with the appended drawings, wherein like elements are provided with the same reference numerals. In the drawings:

FIG. 1 is a sectional view taken through an integrated circuit device according to the present invention;

FIG. 2 is a plan view of FIG. 2; and

FIG. 3 is an enlarged side elevational view of a heat-dissipating container according to the present invention for use with the device of FIG. 1.

DETAILED DESCRIPTION OF THE PREFERRED EMBODIMENTS

As shown in FIGS. 1-3, an integrated circuit chip 110 is mechanically bonded to a metal die pad 112 and is electrically connected to a lead frame 114 by whisker wires 116. The chip 110, die attach pad 112, whisker wires 116, and inner portions of the lead frame elements 114 are encapsulated within a polymer package 120. The encapsulation process can comprise, for example, a conventional transfer molding process. (After encapsulation, the outer portions of the lead frame can be bent into a suitable configuration to facilitate mating with a connector.)

The integrated circuit chip 110 in FIGS. 1 and 2 further includes a miniature container or pipe 130 which forms a hermetically sealed chamber partially filled with a volatile fluid 132 for increasing the heat-dissipating capacity of the chip. The container 130, which is embedded within the package 120 during the molding step, is formed of a relatively conductive heat conducting material, such as aluminum or copper. A bottom surface 135 of the container 130 is bonded to an upper surface of the chip by a conventional suitable adhesive, such as a heat-conductive adhesive (e.g., a polymer epoxy which contains a metal filler like silver) for promoting thermal conductivity. The interior of the container 130 is at a partial vacuum.

In practice an upper surface of the container 130 lies flush with the outer surface of the package 120 or, alternatively, projects beyond the package 120.

In practice, the container 130 is shaped to present relatively larger surface areas at its upper and lower ends in order to maximize the heat absorption and dissipation properties of the container material. The depicted container 130 has an hourglass-like shape, comprising generally frusto-conical upper and lower portions 134, 136 interconnected by a cylindrical intermediate portion 138.

The dimensions of the container 130 must be quite small. For example, it is expected that the diameters of the container 130 at the top and bottom ends thereof will be in the range of about 0.20 to about 1.20 inches, the diameter of the container 130 at the center of its height will be in the range of about 0.05 to about 0.25 inches, and the overall height from end-to-end will be in the range of about 0.15 to about 0.50 inches.

In practice, the container 130 is formed by a suitable process and then is bonded to the chip surface prior to the molding of the package, so as to become embedded in the package following the package-molding step.

In operation, the container 130 acts as a "heat pipe" wherein fluid, which normally is in a liquid state at the lower end of the container 130, vaporizes upon absorbing sufficient heat from the chip. As the vapor rises toward the upper, cooler end of the container 130, it condenses and thereby emits heat. Thus, the volatile fluid should be one, such as alcohol, that vaporizes at a relatively low temperature. Preferably, the fluid should vaporize at a temperature no greater than about 40° C.

As a result of operation of the above-described device, thermal energy generated by the chip is dissipated through the lead frame and, also, heats and vaporizes the fluid in the container 130. The heated vapor rises toward the top of the container 130 where it gives off heat. Upon recondensing, the fluid gravitates as a liquid back to the bottom of the container 130 to be revaporized.

The foregoing has described the principles, preferred embodiments and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of present invention as defined by the following claims.

What is claimed is:

1. A plastic-encapsulated integrated circuit comprising:
   a package formed of plastic,
   an integrated circuit embedded in the package, and
   heat-dissipating means for conducting heat from the integrated circuit, including:
   a hermetically sealed container formed of a heat conductive material embedded in the package and extending from the integrated circuit to at least an outer surface of the package, the container having first and second portions disposed adjacent the integrated circuit and the outer surface of the package, respectively, and an intermediate portion interconnecting the first and second portions, the intermediate portion being of smaller cross-sectional area than the first and second portions; and
   a volatile fluid disposed in the container, for absorbing heat from the integrated circuit by converting the fluid from a liquid state to a vapor state without directly contacting the integrated circuit, and for evaporatively dissipating heat by converting the fluid from a vapor state to a liquid state.

2. A plastic-encapsulated integrated circuit according to claim 1 wherein the first and second portions are of generally frusto-conical shape.

3. A plastic-encapsulated integrated circuit according to claim 2, wherein the intermediate portion is of generally cylindrical shape.

4. A plastic-encapsulated integrated circuit according to claim 1, wherein the container is formed of metal.

5. A plastic-encapsulated integrated circuit according to claim 4, wherein a lower end of the container is bonded to the integrated circuit.

6. A plastic-encapsulated integrated circuit comprising:
   a package formed of plastic,
   an integrated circuit embedded in the package, and
   heat-dissipating means for conducting heat from the integrated circuit, including:
   a hermetically sealed container formed of a heat conductive metal material bonded to the integrated circuit and extending therefrom to at least an outer surface of the package, and
   a volatile fluid disposed in the container for absorbing heat from the integrated circuit, without directly contacting the integrated circuit, while converting from a liquid state to a solid state, and evaporatively dissipating heat while converting from a vapor state to a liquid state, the container including first and second portions disposed adjacent the integrated circuit and the outer surface of the package, respectively, and an intermediate portion interconnecting the first and second portions, the intermediate portion being of smaller cross-section than the first and second portions.

7. A plastic-encapsulated integrated circuit according to claim 6, wherein the first and second portions of the container are of generally frusto-conical shape.

8. A plastic-encapsulated integrated circuit according to claim 7, wherein the intermediate portion is of generally cylindrical shape.

9. A plastic-encapsulated integrated circuit comprising:
   a package formed of plastic;
   an integrated circuit embedded in the package, and
   heat-dissipating means for conducting heat from the integrated circuit, including:
   a hermetically sealed container formed of a heat conductive material embedded in the package and extending from the integrated circuit to at least an outer surface of the package with a lower end of the container being bonded to the integrated circuit by a heat-conductive adhesive; and
   a volatile fluid disposed in the container, for absorbing heat from the integrated circuit by converting the fluid from a liquid state to a vapor state without directly contacting the integrated circuit, and for evaporatively dissipating heat by converting the fluid from a vapor state to a liquid state.

* * * * *